(12) United States Patent
Kawasaki et al.

(10) Patent No.: US 10,150,185 B2
(45) Date of Patent: Dec. 11, 2018

(54) METHOD FOR PRODUCING METAL BALL, JOINING MATERIAL, AND METAL BALL

(71) Applicant: Senju Metal Industry Co., Ltd., Tokyo (JP)

(72) Inventors: Hiroyoshi Kawasaki, Tochigi (JP); Takahiro Roppongi, Tochigi (JP); Daisuke Soma, Tochigi (JP); Isamu Sato, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 34 days.

(21) Appl. No.: 15/116,275

(22) PCT Filed: Feb. 4, 2014

(86) PCT No.: PCT/JP2014/052570
§ 371 (c)(1),
(2) Date: Dec. 12, 2016

(87) PCT Pub. No.: WO2015/118612
PCT Pub. Date: Aug. 13, 2015

(65) Prior Publication Data
US 2017/0182600 A1    Jun. 29, 2017

(51) Int. Cl.
*B23K 35/02* (2006.01)
*B22F 9/08* (2006.01)
(Continued)

(52) U.S. Cl.
CPC ........ *B23K 35/0244* (2013.01); *B22F 1/0003* (2013.01); *B22F 1/0048* (2013.01); *B22F 1/025* (2013.01); *B22F 9/08* (2013.01); *B22F 9/082* (2013.01); *B22F 9/14* (2013.01); *B23K 35/302* (2013.01); *B23K 35/3033* (2013.01);
(Continued)

(58) Field of Classification Search
CPC ........................................................ C22F 1/00
See application file for complete search history.

(56) References Cited

U.S. PATENT DOCUMENTS 9,340,850 B2    5/2016    Shindo et al.
9,668,358 B2    5/2017    Kawasaki et al.
(Continued)

FOREIGN PATENT DOCUMENTS

CN    103415633 A    11/2013
EP    0283587 A1 *  9/1988    ............... C22C 9/00
(Continued)

*Primary Examiner* — Colleen P Dunn
*Assistant Examiner* — Rajinder Bajwa
(74) *Attorney, Agent, or Firm* — The Webb Law Firm (57) ABSTRACT

Produced is a metal ball which suppresses an emitted α dose. Contained are the steps of melting a pure metal by heating the pure metal at a temperature which is higher than a boiling point of an impurity to be removed, higher than a melting point of the pure metal, and lower than a boiling point of the pure metal, the pure metal containing a U content of 5 ppb or less, a Th content of 5 ppb or less, purity of 99.9% or more and 99.995% or less, and a Pb or Bi content or a total content of Pb and Bi of 1 ppm or more, and the pure metal having the boiling point higher than the boiling point at atmospheric pressure of the impurity to be removed; and sphering the molten pure metal in a ball.

16 Claims, 2 Drawing Sheets

(51) Int. Cl.
  *B22F 9/14* (2006.01)
  *B22F 1/00* (2006.01)
  *H01L 23/00* (2006.01)
  *H01L 23/556* (2006.01)
  *H05K 3/34* (2006.01)
  *B23K 35/30* (2006.01)
  *C22C 9/00* (2006.01)
  *C22C 19/03* (2006.01)
  *C22F 1/08* (2006.01)
  *C22F 1/10* (2006.01)
  *B22F 1/02* (2006.01)
  *B23K 1/00* (2006.01)
  *B23K 1/008* (2006.01)
  *B23K 3/06* (2006.01)
  *B23K 101/42* (2006.01)
  *H01L 23/498* (2006.01)

(52) U.S. Cl.
  CPC ............... *C22C 9/00* (2013.01); *C22C 19/03* (2013.01); *C22F 1/08* (2013.01); *C22F 1/10* (2013.01); *H01L 23/556* (2013.01); *H01L 24/11* (2013.01); *H01L 24/13* (2013.01); *H05K 3/3463* (2013.01); *B22F 2009/0848* (2013.01); *B22F 2301/10* (2013.01); *B22F 2301/15* (2013.01); *B22F 2998/10* (2013.01); *B22F 2999/00* (2013.01); *B23K 1/008* (2013.01); *B23K 1/0016* (2013.01); *B23K 3/0623* (2013.01); *B23K 2201/42* (2013.01); *H01L 23/49816* (2013.01); *H01L 24/16* (2013.01); *H01L 2224/111* (2013.01); *H01L 2224/11334* (2013.01); *H01L 2224/132* (2013.01); *H01L 2224/133* (2013.01); *H01L 2224/136* (2013.01); *H01L 2224/1312* (2013.01); *H01L 2224/13014* (2013.01); *H01L 2224/1316* (2013.01); *H01L 2224/13016* (2013.01); *H01L 2224/1317* (2013.01); *H01L 2224/1318* (2013.01); *H01L 2224/1332* (2013.01); *H01L 2224/1336* (2013.01); *H01L 2224/1337* (2013.01); *H01L 2224/1338* (2013.01); *H01L 2224/1339* (2013.01); *H01L 2224/1369* (2013.01); *H01L 2224/13105* (2013.01); *H01L 2224/13109* (2013.01); *H01L 2224/13117* (2013.01); *H01L 2224/13118* (2013.01); *H01L 2224/13123* (2013.01); *H01L 2224/13124* (2013.01); *H01L 2224/13138* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/13157* (2013.01); *H01L 2224/13163* (2013.01); *H01L 2224/13164* (2013.01); *H01L 2224/13166* (2013.01); *H01L 2224/13169* (2013.01); *H01L 2224/13171* (2013.01); *H01L 2224/13172* (2013.01); *H01L 2224/13173* (2013.01); *H01L 2224/13176* (2013.01); *H01L 2224/13178* (2013.01); *H01L 2224/13179* (2013.01); *H01L 2224/13181* (2013.01); *H01L 2224/13183* (2013.01); *H01L 2224/13184* (2013.01); *H01L 2224/13211* (2013.01); *H01L 2224/13294* (2013.01); *H01L 2224/13305* (2013.01); *H01L 2224/13309* (2013.01); *H01L 2224/13317* (2013.01); *H01L 2224/13318* (2013.01); *H01L 2224/13323* (2013.01); *H01L 2224/13324* (2013.01); *H01L 2224/13338* (2013.01); *H01L 2224/13339* (2013.01); *H01L 2224/13344* (2013.01); *H01L 2224/13347* (2013.01); *H01L 2224/13349* (2013.01); *H01L 2224/13355* (2013.01); *H01L 2224/13357* (2013.01); *H01L 2224/13363* (2013.01); *H01L 2224/13364* (2013.01); *H01L 2224/13366* (2013.01); *H01L 2224/13369* (2013.01); *H01L 2224/13371* (2013.01); *H01L 2224/13372* (2013.01); *H01L 2224/13373* (2013.01); *H01L 2224/13376* (2013.01); *H01L 2224/13378* (2013.01); *H01L 2224/13379* (2013.01); *H01L 2224/13381* (2013.01); *H01L 2224/13383* (2013.01); *H01L 2224/13384* (2013.01); *H01L 2224/13611* (2013.01); *H01L 2224/13655* (2013.01); *H01L 2224/13657* (2013.01); *H01L 2224/16145* (2013.01); *H01L 2224/16225* (2013.01); *H01L 2224/81011* (2013.01); *H01L 2924/381* (2013.01); *H01L 2924/3841* (2013.01); *H05K 3/3436* (2013.01); *H05K 2203/041* (2013.01)

(56) References Cited

U.S. PATENT DOCUMENTS

| | | | |
|---|---|---|---|
| 9,816,160 | B2 | 11/2017 | Kurata et al. |
| 2003/0062261 | A1 | 4/2003 | Shindo |
| 2003/0141342 | A1* | 7/2003 | Kurata .................. B22F 1/0048 228/56.3 |
| 2006/0186179 | A1* | 8/2006 | Levine ................. B23K 20/007 228/180.5 |
| 2008/0012131 | A1 | 1/2008 | Tanaka |
| 2014/0010705 | A1* | 1/2014 | Kanou ...................... C22C 9/00 420/491 |
| 2016/0148885 | A1* | 5/2016 | Kawasaki .............. B23K 35/26 420/491 |
| 2016/0368105 | A1 | 12/2016 | Hattori et al. |

FOREIGN PATENT DOCUMENTS

| | | |
|---|---|---|
| EP | 1900853 A1 | 3/2008 |
| EP | 2929960 A1 | 10/2015 |
| EP | 3047924 A1 | 7/2016 |
| EP | 3067151 A1 | 9/2016 |
| JP | 9186161 A | 7/1997 |
| JP | 2002206103 A | 7/2002 |
| JP | 2003193283 A | 7/2003 |
| JP | 200536301 A | 2/2005 |
| JP | 2011214061 A | 10/2011 |
| JP | 2013185214 A | 9/2013 |
| WO | 9524113 A1 | 9/1995 |
| WO | 2007004394 A1 | 1/2007 |

* cited by examiner

METHOD FOR PRODUCING METAL BALL, JOINING MATERIAL, AND METAL BALL

CROSS-REFERENCE TO RELATED APPLICATION

This application is the United States national phase of International Application No. PCT/JP2014/052570 filed Feb. 4, 2014, the disclosure of which is hereby incorporated in its entirety by reference.

TECHNICAL FIELD

The present invention relates to a method of producing a metal ball with a low α dose; a metal ball produced by this method; and a joining material.

BACKGROUND ART

Recently, along development of compact information equipment, electronic components to be mounted have been downsized rapidly. A ball grid alley (hereinafter referred to as "BGA") having electrodes at its rear surface is applied to such electronic components in order to cope with a narrowed connection terminal and a reduced mounting area because of the downsizing requirement.

As the electronic components to which the BGA is applied, for example, a semiconductor package is exemplified. In the semiconductor package, semiconductor chips having electrodes are sealed with resin. Solder bumps are formed on the electrodes of the semiconductor chips. This solder bump is formed by joining a solder ball to an electrode of the semiconductor chip. The semiconductor package to which the BGA is applied is mounted on a printed circuit board by mounting it on the printed circuit board so that each solder bump contacts a conductive land of the printed circuit board and joining the solder bump melted by the heating to the land. Additionally, a three-dimensional high-density mounting structure has been studied by stacking up the semiconductor packages in a height direction in order to meet the further high-density mounting requirement.

However, when a BGA is formed on a semiconductor package having a three-dimensional high-density mounting structure, solder balls are crushed by the self-weight of the semiconductor package, and short circuits occur between the electrodes. This may hinder for the high-density mounting.

Therefore, solder bumps using metal balls each with a very small diameter, which are made of metal such as Cu with a melting point higher than that of solder, have been studied (for example, see Patent Literature 1). The solder bump including the metal balls can support the semiconductor package by the metal balls that are not melted at the melting point of the solder even when the weight of the semiconductor package is applied to the solder bump when the electronic component is mounted on the printed circuit board. Accordingly, the solder bump is not crushed by the weight of the semiconductor package itself.

PRIOR ART DOCUMENT

Patent Document

Patent Literature 1: International Publication No. WO 95/24113

SUMMARY OF INVENTION

Problems to be Solved by the Invention

Downsizing of electronic components allows high-density mounting, but the high-density mounting may cause software error problems. Software errors can cause the rewriting of memory due to the entry of α rays into memory cells of a semiconductor integrated circuit (hereinafter referred to as "IC").

The α rays are considered to be emitted by α decay of radioactive elements such as U, Th and Po as impurities contained in a solder alloy. Therefore, solder alloys having a composition that achieves a low α dose have been under development.

On the other hand, metal balls are also required to have a composition that achieves a low α dose. Here, when a metal ball is produced using a metal material having a high purity, a low α dose can be achieved because the content of impurities including radioactive elements is reduced. However, the cost therefor increases. In addition, when a metal ball is produced using a metal material having a high purity, sphericity, which is a measure of how spherical an object is, decreases.

The present invention has an object to provide a method of producing a metal ball with a low α dose; a metal ball with high sphericity, which is produced by this method; and a joining material.

Means for Solving the Problems

The inventors have found that even if purity in metal materials on the market is from 99.9 to 99.995%, U or Th therein is reduced to 5 ppb or less. Moreover, the inventors have focused on that the cause of software errors is impurities such as $^{210}$Po slightly remaining therein such that its content cannot be quantitatively measured. In addition, the inventors have found that by setting a temperature with focusing on a boiling point of the impurities in a heating step when producing the metal ball, the α dose in the produced metal ball is reduced to 0.0200 cph/cm$^2$ or less even if the purity is 99.995% or less.

They have also found that the decrease of sphericity is inhibited when the purity in the metal material is 99.995% or less.

Here, the present invention is as follow.

(1) A method of producing a metal ball, the method including the steps of: melting a pure metal, which contains a U content of 5 ppb or less, a Th content of 5 ppb or less, purity of 99.9% or more and 99.995% or less, and a Pb or Bi content or a total content of Pb and Bi of 1 ppm or more, by heating the pure metal at a heating temperature which is set to be higher than a boiling point of an impurity to be removed, higher than a melting point of the pure metal, and lower than a boiling point of the pure metal, according to the boiling points and melting point changing depending on the atmosphere, the pure metal having the boiling point at atmospheric pressure higher than the boiling point at atmospheric pressure of the impurity to be removed among impurities contained in the pure metal; and sphering the molten pure metal into a ball.

(2) The method of producing a metal ball according to the above-mentioned item (1), wherein the melting point of the pure metal at the atmospheric pressure is 900 degrees C. or higher and the boiling point thereof is 962 degrees C. or higher.

(3) The method of producing the metal ball according to the above-mentioned item (2), wherein the impurity to be removed is Po.

(4) The method of producing the metal ball according to any one of the above-mentioned items (1) to (3), further including an annealing step of annealing the sphered metal ball.

(5) A joining material containing the metal ball produced by the method according to any one of the above-mentioned items (1) to (4).

(6) A metal ball produced by the method according to any one of the above-mentioned items (1) to (4), wherein the metal ball has an α dose of 0.0200 cph/cm2 or less and sphericity of 0.90 or more.

(7) A joining material containing the metal ball of claim 6.

Effects of Invention

According to the present invention, it is possible to produce the metal ball with suppressed α dose to be emitted. It is also possible to improve the sphericity of the metal ball with suppressed α dose.

DESCRIPTION OF EMBODIMENTS

The present invention will be described below more in detail. In this description, units (ppm, ppb, %) regarding the composition of a metal ball represent proportions (mass ppm, mass ppb, mass %) relative to the mass of the metal ball unless otherwise specified.

A method of producing a metal ball according to the present invention includes a step of melting a metal material, which is a pure metal, by heating it, and a step of sphering the molten metal material. In the method of producing a metal ball according to the present invention, among the impurities contained in the metal material, in order to reduce the content of the impurity causing α decay with the lapse of time, the metal material is heated at a heating temperature T that is higher than the boiling point $t_1$ of the impurity to be removed.

In the step of melting the metal material by heating it, the metal material having a melting point $t_2$ in the vicinity of the boiling point $t_1$ of the impurity, and a boiling point $t_3$ not lower than the boiling point $t_1$ is selected for melting the metal material without volatilization at the heating temperature T not lower than the boiling point $t_1$ of the impurity, when the melting point of the metal material is to be $t_2$ and the boiling point thereof is set to be $t_3$. The heating temperature T is set to be lower than the boiling point $t_3$ of the metal material. The melting point $t_2$ of the metal material is higher than that of solder, and the metal ball produced by the method according to the present invention is not melted at the heating temperature in soldering. The boiling point and melting point of the impurity and metal material depend on the atmospheric pressure so that the heating temperature T is set according to the atmospheric pressure.

By the method of producing the metal ball including this heating step, a metal ball containing a U content of 5 ppb or less, a Th content of 5 ppb or less, purity of 99.9% or more and 99.995% or less, an α dose of 0.0200 cph/cm² or less, a Pb or Bi content, or a total content of Pb and Bi of 1 ppm or more, and sphericity of 0.90 or more is produced.

As the metal material for producing the metal ball, Cu, Ni, Ag, Fe, Co, Au, Nd, Ge and the like are selected. Further, as the metal material, Pt, Ti, Lu, Pd, Tm, Sc, Er, Y, Ho, Dy, Tb, Gd, Be, Mn, Pm, Pr, La, Ca, Eu, Yb, Ce, Sr, Ba, Al, Mg, Sb, Te, Cn, Li, In, Ga and the like are selected. Still further, as the metal material, W, Re, Os, Ta, Mo, Nb, Ir, Ru, Hf, Tc, Rh, V, Cr, Zr and the like are selected.

Figure 1:
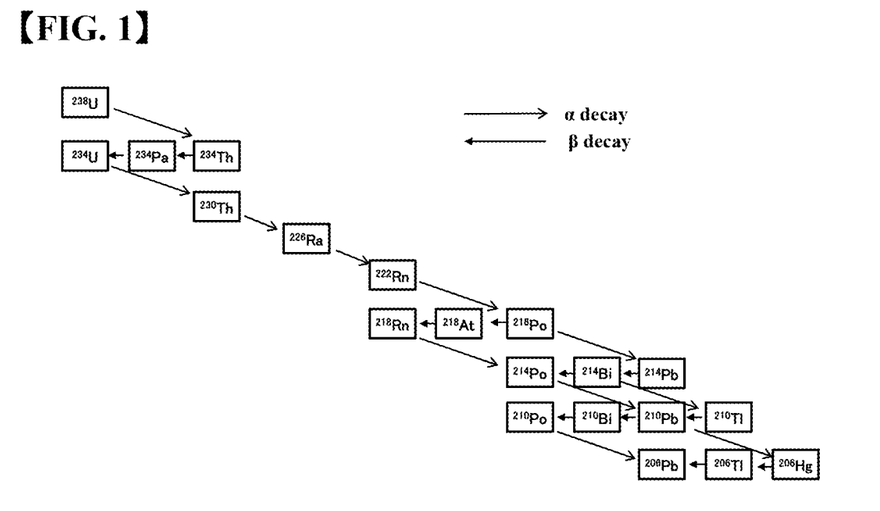
FIG. 1 is a diagram for illustrating the series of uranium decay.
Figure 2:
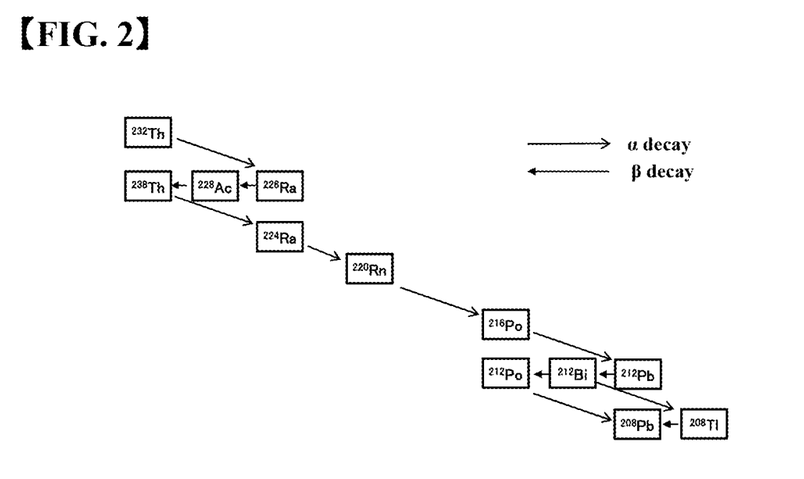
FIG. 2 is a diagram for illustrating the series of thorium decay.
Figure 3:
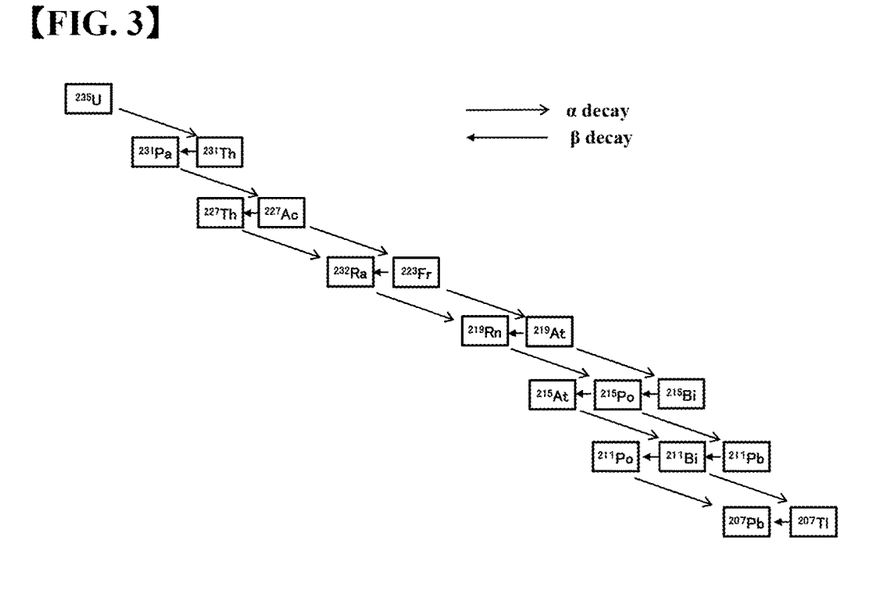
FIG. 3 is a diagram for illustrates the series of actinium decay.

FIG. 1 is a diagram for illustrating the series of uranium decay; FIG. 2 is a diagram for illustrating the series of thorium decay; and FIG. 3 is a diagram for illustrates the series of actinium decay. Elements whose isotopes existing at a high relative isotopic abundance ratio are used as the α-ray source regardless of high melting point, such as U and Th, or the elements which are used as the α-ray source by way of decay caused by aging variation, can reduce the α dose by the method according to the present invention, but cannot reduce the α dose to the level for software error prevention. Accordingly, the elements shown by the decay series of FIGS. 1 to 3 have been excluded from the metal material for producing the metal ball.

The composition, α dose, and sphericity of the metal ball produced by the method according to the present invention will be described below more in detail.

<α Dose: 0.0200 Cph/Cm² or Less>

The α dose in the metal ball produced by the method according to the present invention is 0.0200 cph/cm² or less. This is such an α dose that it is insignificant for any soft errors in the high-density mounting of the electronic components. The method of producing the metal ball according to the present invention includes a step of heating a metal material at a temperature at which $^{210}$Po as an impurity to be removed evaporates, whereby $^{210}$Po slightly remaining in the metal material evaporates, and the metal ball exhibit a further lower α dose than the metal material. The α dose is preferably 0.0020 cph/cm² or less, and more preferably 0.0010 cph/cm² or less from the viewpoint of suppressing software errors in higher density mounting.

<U: 5 Ppb or Less, Th: 5 Ppb or Less>

U and Th are radioactive elements, and their contents must be reduced for suppressing software errors. Each of the U and Th contents must be 5 ppb or less, in order to reduce the α dose in the metal ball to 0.0200 cph/cm² or less. In addition, in order to suppress software errors in the present or future high-density mounting, each of the U and Th contents is preferably 2 ppb or less.

<Pb or Bi Content, or Total Content of Pb and Bi is 1 Ppm or More>

It is conceivable that as impurity elements contained in the metal ball, Sn, Sb, Bi, Ni, Zn, Fe, Al, As, Ag, In, Cd, Cu, Pb, Au, P, S, U and Th. It is preferable that the metal ball particularly contains, among the impurity elements listed above, Pb or Bi content or total content of Pb and Bi, as impurity elements, of 1 ppm or more. In the present invention, when reducing the α dose, it is not required to reduce the content of either Pb or Bi, or the total content of Pb and Bi to the minimum thereof. The reason is as follows.

$^{210}$Pb turns to $^{210}$Bi by β decay, and $^{210}$Bi turns to $^{210}$Po by β decay, and $^{210}$Po turns to $^{206}$Pb by α decay. Therefore, in order to reduce the α dose, the Pb or Bi content or total content of Pb and Bi, as impurity elements, is also likely preferably as low as possible.

However, the content ratio of $^{210}$Pb contained in Pb and $^{210}$Bi contained in Bi is low. Accordingly, if the Pb and Bi contents are reduced to a certain degree, it is conceivable that $^{210}$Pb and $^{210}$Bi are sufficiently removed to the degree which allows the reduction of the α dose to the above-described range. On the other hand, in order to increase the sphericity of the metal ball, as will be described later, the impurity element content is preferably high. When both of Pb and Bi as impurity elements are contained in the metal material, they work as crystal core at the time of melting in the production process of the metal ball, and increase the sphericity of the metal ball. Therefore, it is preferable that Pb and/or Bi be contained in an amount which allows the removal of $^{210}$Pb and $^{210}$Bi to the degree where the α dose is reduced to the above-described range. From this viewpoint, the metal ball preferably has a Pb or Bi content or a total content of Pb and Bi of 1 ppm or more.

The content of Pb or Bi, or the total content of Pb and Bi is more preferably 10 ppm or more. The upper limit is no limited as long as the α dose can be reduced, but it is more preferable that the content of Pb or Bi, or the total content of Pb and Bi is less than 1000 ppm, from the viewpoint of reducing deterioration of electric conductivity of the metal ball. The Pb content is more preferably from 10 ppm to 50 ppm, and the Bi content is more preferably from 10 ppm to 50 ppm.

<Purity of Metal Ball: 99.9% or More and 99.995% or Less>

The metal ball has purity of 3N or more and 4N5 or less. In other words, the metal ball has an impurity element content of 5 ppm or more. Here, the purity of the metal material such as Cu is defined as 2N for 99%, 3N for 99.9%, and 4N for 99.99%. 4N5 means that the metal material has purity of 99.995%.

When the purity of the metal material constituting the metal ball is within this range, a sufficient amount of crystal core for increasing the sphericity of the metal ball can be secured in the molten metal material. The reason for the increase in the sphericity will be specified more in detail as follows.

When the metal balls are produced, the metal material formed into small pieces having a certain shape is melted by heating, the molten metal material becomes a sphere shape with a surface tension, and it coagulates to form metal balls. In a process from a liquid of the molted metal material to the coagulation, the crystal grains grow up in the spherical molten metal material. At this case, if impurity elements are abundant, these impurity elements become crystal cores to suppress the growth of crystal grains. Therefore, the spherical molten metal material forms the metal ball having the high sphericity with the micro crystal grains that are suppressed in their growth.

On the other hand, if the amount of impurity elements is little, the relative small amount thereof becomes the crystal cores so that the grains are not suppressed to grow but they grow in a certain direction. As a result, the spherical molten metal material coagulates with the surface partly protruded. Such metal ball has the low sphericity. It is conceivable that the impurity elements are Sn, Sb, Bi, Zn, Fe, Al, As, Ag, In, Cd, Cu, Pb, Au, P, S, U, Th and the like.

The lower limit of the purity is not particularly limited, but is preferably 3N or more, from the viewpoint of reducing the α dose, and restraining deterioration of electric conduction and heat conductivity of the metal ball caused by decrease of the purity. In other words, the content of the impurity elements in the metal ball excluding main metal material thereof is preferably less than 1000 ppm.

<Sphericity of Metal Ball: 0.90 or More>

As for the shape of the metal ball, its sphericity is preferably 0.90 or more, from the viewpoint of controlling the stand-off height. If the sphericity of the metal ball is less than 0.90, the shape of the metal ball is not identified, so that bump having non-uniform height is formed during the bump formation process, and a possibility of occurrence of bonding defect increases. The sphericity is more preferably 0.94 or more. In the present invention, the sphericity represents a deviation from a true sphere. The sphericity is determined by various methods such as the least squares center method (LSC method), minimum zone center method (MZC method), the maximum inscribed center method (MIC method), and minimum circumscribed center method (MCC method).

<Diameter of Metal Ball: 1 to 1000 μm>

The diameter of the metal ball is preferably from 1 to 1000 μm. When the diameter is within this range, the metal balls are stably produced, and the short circuit caused by a narrow pitch between the terminals is prevented.

<Method for Producing Metal Ball>

In the method of producing the metal ball according to the present invention, the metal material is heated and melted at a temperature which is higher than the boiling point $t_1$ of Po and under the atmospheric pressure, is higher than 962 degrees C., which is the boiling point $t_1$ of Po under the atmospheric pressure, to sphere the metal ball, in order to reduce the content of the impurity causing α decay, $^{210}$Po in this embodiment, among the impurities contained in the metal material. In this manner, Po in the metal material volatilizes, and the α dose emitted from the metal ball is reduced.

(1) Method for Producing Cu Ball

As an example of the method of producing the metal ball according to the present invention, a method of producing a Cu ball will be described blow. The Cu material for the Cu ball as a metal ball is placed on a heat-resistant plate such as a ceramic plate, and is heated in a furnace together with the heat-resistant plate. The heat-resistant plate has a plurality of circular grooves each having a semispherical bottom. The diameter and depth of each groove are appropriately set according to the particle size of the Cu ball. For example, the diameter is 0.8 mm, and the depth is 0.88 mm. The Cu material in a chip form obtained by cutting thin Cu wire (hereinafter referred to as "chip material") is charged into the grooves in the heat-resistant plate one by one.

The heat-resistant plate whose grooves are charged with the chip material is heated to 1100 to 1300 degrees C., which is a higher temperature than 962 degrees C. as the boiling point $t_1$ of Po under the atmospheric pressure, in a furnace filled with an ammonia decomposing gas, and is subjected to heat treatment for 30 to 60 minutes. At this time, when the temperature in the furnace reaches or exceeds the melting point of Cu, the chip material is melted into spheres. Thereafter, the inside of the furnace is rapidly cooled to the room temperature (for example, 25 degrees C.) or cooling gas temperature, and the Cu ball 2 is molded in each of the grooves of the heat-resistant plate. After cooling, the molded Cu ball is subjected to heat treatment again at 800 to 1000 degrees C., which is the temperature below the melting point of Cu.

Alternatively, as other methods, a atomizing method in which droplets of molten Cu are dropped from an orifice at the bottom of a crucible and the droplets are rapidly cooled to form Cu balls, and a method in which Cu cut metal is heated by heat plasma to 1000 degrees C. or higher, is rapidly cooled, and then is sphered are exemplified. The Cu ball thus sphered may be reheated at 800 to 1000 degrees C. for 30 to 60 minutes. In addition, before the Cu ball is sphered, the Cu material for the Cu ball 2 may be heated at 800 to 1000 degrees C.

For the Cu material for the Cu ball, for example, pellets, wires, pillars or the like may be used. The purity of the Cu material may be from 99.9 to 99.99%, from the viewpoint of not excessively reducing the purity of the Cu ball.

When a high purity Cu material is used, the retention temperature for the molten Cu may be decreased to about 1000 degrees C. in the same manner as in the conventional art, without carrying out the above-described heat treatment. In this manner, the above-described heat treatment may be appropriately omitted or changed according to the purity and α dose of the Cu material. In addition, when a Cu ball having a high α dose or an odd-form Cu ball is obtained, these Cu balls may be reused as raw materials, which allow further decrease of the α dose.

Additionally, a treatment referred to as "annealing" in which the sphered Cu ball is annealed may be performed. In the production of the metal ball, when the metal ball is produced using a metal material having a purity of about 3N, a metal ball having high sphericity and high hardness is produced. On the other hand, when the metal ball is produced using a metal material having high purity, for example, 45N5 or more, the metal ball produced has low sphericity, but is low in hardness.

Therefore, in order to produce a metal ball having high sphericity and low hardness, the annealing treatment is carried out after the sphering. When the metal ball is a Cu ball, it is heated to, for example, about 700 degrees C. after the sphering. As a result of this annealing treatment, the Vickers hardness of 60 HV or more before the annealing is reduced to less than 60 HV.

(2) Method for Producing Ni Ball

Next, as an example of the method of producing the metal ball according to the present invention, a method of producing a Ni ball will be described below. The Ni ball is produced by an atomizing method. The atomizing method in the present invention is referred as a method in which a Ni material is melted at 1000 degrees C. or higher, which is a higher temperature than 962 degrees C. as the boiling point $t_1$ of Po under the atmospheric pressure, and the molten Ni in a liquid state is sprayed from a nozzle at a high speed, thereby cooling the atomized molten Ni to sphere the Ni balls. The atomizing method includes, for example, a gas atomizing method when gas is used as the medium for spraying the molten Ni from a nozzle at a high speed.

Further, as another atomizing method, droplets of molten Ni are dropped from an orifice, and the droplets are cooled to sphere the Ni balls. The Ni balls sphered by each of the atomizing methods may be subjected to re-heating at a temperature of 800 to 1000 degrees C. for 30 to 60 minutes.

In these methods of producing the Ni ball, the Ni material may be preliminary heated at 800 to 1000 degrees C. before the Ni ball is sphered.

For the Ni material for the Ni ball, pellets, wires, plate material or the like may be used. The purity of the Ni material is from 2 N to 4 N, from the viewpoint of not excessively decreasing the purity of the Ni ball.

When a Ni material having such high purity is used, the retention temperature for the molten Ni may be decreased to about 1000 degrees C. in the same manner as in the conventional art, without carrying out the above-described heating treatment. In this manner, the above-described heating treatment may be appropriately omitted or changed according to the purity and α dose of the Ni material. In addition, when a Ni ball having a high α dose or an odd-form Ni ball is obtained, these Ni balls may be reused as raw materials, which allow further decrease of the α dose.

In order to produce a Ni ball having high sphericity and low hardness, the annealing treatment in which the sphered Ni ball is annealed may be performed.

<Application Example of Metal Ball>

The metal ball, such as a Cu or Ni ball, produced by the method according to the present invention is applicable to a solder joining material. When the metal ball is applied to the solder joining material, a solder layer (solder plating film) is formed on a surface of the metal ball to make a metal core ball.

The composition of the solder layer is not particularly limited, as long as the alloy has a composition of lead free solder alloy composed mainly of Sn. The solder layer may be a Sn plating film. For example, Sn, a Sn—Ag alloy, a Sn—Cu alloy, a Sn—Ag—Cu alloy, a Sn—In alloy, and the above alloys containing a certain alloy element are exemplified. The Sn content is 40 mass % or more in all of them. As the alloy element to be added, for example, Ag, Cu, In, Ni, Co, Sb, Ge, P, Fe and the like exemplified. Among them, the alloy composition of the solder layer is preferably a Sn-3Ag-0.5Cu alloy, from the viewpoint of dropping shock properties.

The thickness of the solder layer is not particularly limited, but preferably, 100 μm (one side) or less is sufficient, commonly from 20 to 50 μm.

The metal ball produced by the method according to the present invention has an α dose of 0.0200 cph/cm$^2$ or less. The α dose in the metal core ball to which this metal ball is applied is also defined as 0.0200 cph/cm$^2$ or less, for suppressing any software errors in high-density mounting of electronic components.

Therefore, each of the U and Th contents in the solder layer must be 5 ppb or less. In addition, from the viewpoint of suppressing software errors in the present or future high-density mounting, each of the U and Th contents is preferably 2 ppb or less.

In addition, the solder layer is formed at up to 100 degrees C., so that it is hard to think that the contents of radioactive elements such as U, Th, and Po and radioisotopes such as $^{210}$Bi and $^{210}$Pb are reduced by evaporation of the radioactive elements and radioisotopes. However, when plating is carried out under fluidization of the plating solution and the metal ball, U, Th, Po, $^{210}$Pb, and $^{210}$Bi form salts that are precipitated in the plating solution. The precipitated salts are electrically neutral, and are not mixed into the solder layer even if the plating solution is flowing.

As a result, the content of radioactive elements in the solder layer markedly decreases. Accordingly, the metal core ball, to which the metal ball produced by the method according to the present invention is applied, shows a low α dose since it is covered with the solder layer. The α dose is preferably 0.0020 cph/cm$^2$ or less, more preferably 0.0010 cph/cm$^2$ or less, from the viewpoint of suppressing software errors in further high-density mounting.

The lower limit of the amount of impurities is not particularly limited since the content of radioactive elements and the α dose decrease as the purity of the metal material forming the solder layer increases, that is, as the content of impurities decreases. On the other hand, the upper limit thereof is preferably 150 ppm or less, more preferably 100 ppm or less, still more preferably 50 ppm or less, yet more preferably 10 ppm or less from the viewpoint of reducing the α dose.

When the solder layer is made of Sn solder, the purity of the solder layer is the total content of impurities other than Sn in the solder layer. When the solder layer is made of a solder alloy of Sn-3Ag-0.5Cu, the purity of the solder layer is the total content of impurities other than Sn, Ag, and Cu in the solder layer.

As the impurities contained in the solder layer, Ag, Ni, Pb, Au, U, Th and the like are exemplified. When the solder layer is made of an Sn—Ag—Cu alloy, Sb, Fe, As, In, Ni, Pb, Au, U, Th and the like are exemplified.

In the metal core ball to which the metal ball produced by the method according to the present invention is applied, before the formation of the solder layer, the surface of the metal ball may be previously coated with a layer of other metal. In particular, when the metal ball surface is previously coated with, for example, a Ni layer or a Co layer, elution of the metal material forming the metal ball into the solder layer can be reduced when the metal elements such as Ni or Co in the coating layer are poorly diffused than the metal element of the metal ball. The coating layer thus functions as a diffusion prevention layer.

The metal composing the diffusion prevention layer is not limited to a single metal, and may be an alloy composed of two or more elements selected from Ni, Co, and others. The thickness of the diffusion prevention layer is commonly from 0.1 to 20 μm at one side.

In addition, the metal core ball, to which the metal ball produced by the method according to the present invention is applied, may be previously subjected to strike plating treatment before the formation of the solder layer. The strike plating treatment removes the oxide film from the metal surface, and improves adhesion between the metal ball and the solder layer.

The metal ball produced by the method according to the present invention and the metal core ball to which the metal ball is applied may be used in a solder joint of electronic components. In addition, the metal ball and the metal core ball may be used in foamed solder composed of the metal balls or metal core balls dispersed in solder. Furthermore, the metal ball and the metal core ball may be used in solder paste prepared by mixing solder powder, the metal balls or metal core balls, and a flux. In the foamed solder and the solder paste, for example, a solder alloy having a composition of Sn-3Ag-0.5Cu (each numeric value is based on mass %) is used. The present invention is not limited to this solder alloy.

In addition, the metal ball produced by the method according to the present invention and the metal core ball to which the metal ball is applied may have a flux layer on the surfaces thereof. The flux layer is composed of one or more kinds of components including a compound acting as an activator for oxidation prevention of the metal surface and removal of the metal oxide film. The component composing the flux layer attaches to the surface of the metal ball or the metal core ball in a solid state. Therefore, the flux layer may be composed of a component which attaches to the surface of the metal ball or metal core ball in a solid state, prevents oxidation of the surface of the metal ball or metal core ball, and acts as an activator which removes the metal oxide film from the object to be joined in soldering. For example, the flux layer may be formed of a single component composed of a compound which acts as an activator and adheres to the metal ball or the metal core ball.

As the activator composing the flux layer, any one of an amine, an organic acid and a halogen, a combination of a plurality of amines, a combination of a plurality of organic acids, a combination of a plurality of halogens, a combination of a single amine, a single organic acid and a single halogen or a combination of plural amines, organic acids and halogens is added.

In addition, the flux layer may be composed of a plurality of components including a compound acting as an activator, and a compound acting as an auxiliary activator. The compound composing the flux layer, for example, the compound acting as an activator may not be a solid as it is as long as it is solidified when mixed with other mixtures.

As the auxiliary activator composing the flux layer, according to the properties of the activator, esters, amides, any one of an ester, an amide, an amino acid, a combination of a plurality of esters, a combination of a plurality of amides, a combination of a plurality of amino acids, a combination of a single ester, a single amide and a single amino acid or a combination of plural esters, amides and amino acids is added. amino acids, a combination of a plurality of esters, a combination of a plurality of amides, a combination of a plurality of amino acids, and a combination of a single or a plurality of esters, amides, and amino acids.

In addition, the flux layer may contain rosin or resin for protecting the compound acting as an activator from heat in reflowing. Furthermore, the flux layer may contain resin for attaching the compound acting as an activator to the metal ball or the metal core ball.

The flux layer may be formed of a single layer composed of a single compound or a plurality of compounds. In addition, the flux layer may be formed of a plurality of layers composed of a plurality of compounds. The component composing the flux layer 3 adheres to the surface of the metal ball or metal core ball in a solid state. However, the flux must be in a liquid or gas state in the step of attaching the flux to the metal ball or the metal core ball.

Therefore, when coating is carried out using a solution, the component composing the flux layer must be soluble in the solvent. For example, when a salt is formed, an insoluble component is formed in the solvent. If the insoluble component is formed in the liquid flux, uniform adsorption is difficult in a flux containing components with low solubility which can form deposits. Therefore, in the conventional art, a liquid flux cannot be prepared by mixing compounds which can form salts.

On the other hand, when a multilayered flux layer is formed by forming and solidifying the flux layers one by one, the flux layer can be formed even if a compound to be used forms a salt and is immiscible with a liquid flux.

The metal ball produced by the method according to the present invention and the metal core ball to which the metal ball is applied may be used as follows. Solder paste is applied to an electrode, the metal ball or the metal core ball is directly mounted on the paste and the metal ball or metal core ball and the electrode are bonded together. Alternatively, a foamed solder or the like containing the metal ball or metal core ball dispersed therein may be used. Further, solder paste previously containing the metal ball or the metal core ball may be prepared by mixing solder powder, flux, and the metal ball or metal core ball together. At this time, two or more species of solder powder having different compositions or particle sizes may be added simultaneously.

Furthermore, the metal ball may be mixed with a polymer binder and a solvent to make a metal ball paste. As the polymer binder, epoxy acrylate, acrylic resins, epoxy resins, phenolic resins, polyester resins, polyimide, polyvinyl acetate and the like may be used. As the solvent, Ethyleneglycol monobutyl ether acetate, benzyl alcohol, ethyl acetate, methyl ethyl ketone, butyl carbitol and the like may be used.

When they are used by the above-described method, the composition of the solder alloy for the solder paste or the foamed solder and the composition of the solder powder for the solder paste, used together with the metal ball or the metal core ball, are not particularly limited, but the α dose thereof is preferably 0.0200 cph/cm² or less.

In addition, the metal ball such as the Cu ball or the Ni ball produced by the method according to the present invention is also applicable to a conductive joining material. The conductive joining material herein means those used for joining by thermosetting resin at a temperature lower than the melting point of the conductive metal powder (metal ball). In the present invention, the solder joining material and the conductive joining material are collectively referred to as a joining material.

Executed Examples

Executed examples of the method of producing the metal ball according to the present invention will be described below; however, the present invention is not limited thereto.

<Relationship Among Purity, Sphericity, and α Dose of Cu Ball>

Cu balls having different purities were made as metal balls, their sphericity and α dose were measured, and the relationship between the purity and sphericity of the Cu balls, and the α dose were verified.

(1) Making of Cu Ball

The Cu ball of Executed Example 1A was made using a Cu pellet having purity of 99.9% (3N). The Cu ball of Executed Example 2A was made using a Cu wire having purity of 99.995% (4N5) or less. The Cu ball of Comparative Example 1A was made using a Cu plate having purity of more than 99.995% (4N5).

The above-described raw materials were sphered by the gas atomizing method. As a result, Cu balls having an average particle size of 50 m were made.

(2) Method for Measuring α Dose of Cu Ball

The method for measuring the α dose will be described below. The α dose was measured using an α-ray measuring device of a gas flow proportional counter. The measurement sample was a flat shallow container of 300 mm×300 mm in which Cu balls were bedded such that the bottom of the container was completely covered with the Cu balls. This measurement sample was placed in the α-ray measuring device, allowed to stand for 24 hours in a PR-10 gas flow, and then the α dose was measured.

The PR-10 gas (argon 90% and methane 10%) used for the measurement was the PR-10 gas elapsed three weeks or more since the PR-10 gas was charged into a gas cylinder. A reason why using the gas cylinder after a lapse of three weeks or more is based on JESD221 of JEDEC STANDARD-Alpha Radiation Measurement in Electronic Materials determined by JEDEC (Joint Electron Device Engineering Council) so as not to produce the alpha-ray by radon in the atmospheric air that enters into the gas cylinder.

(3) Method for Measuring Sphericity of Cu Ball

The sphericity was measured as follows. The sphericity was determined by the CNC image measurement system. In the present example, the lengths of the major axis and diameter of the Cu ball were measured by Ultra Quick Vision, ULTRA QV350-PRO, manufactured by Mitutoyo Corporation, and the diameters of the 500 Cu balls were divided by the respective major axes, and the arithmetic mean value was calculated to determine the sphericity. This shows that the closer the value to 1.00 as the upper limit, the closer the ball to a true sphere.

Table 1 shows the result of the elemental analysis, sphericity, and α dose of the Cu ball thus made. In Table 1, the unit is based on mass ppb for U and Th, and mass ppm for other elements.

TABLE 1

| | Cu ball composition | | | | | | | | | | | | | | | α dose | Sphericity |
|---|---|---|---|---|---|---|---|---|---|---|---|---|---|---|---|---|---|
| | Cu | Sn | Sb | Bi | Zn | As | Ag | Cd | Ni | Pb | Au | P | S | U | Th | (cph/cm²) | of Cu ball |
| Executed Example 1A | bal. | 84 | 21 | 32 | 3 | 49 | 20 | 7 | 4 | 16 | 4 | 200 | 18 | 1.5 | <0.5 | <0.0010 | 0.9562 |
| Executed Example 2A | bal. | 8 | 10 | 19 | — | 24 | 13 | — | 1 | 8 | — | — | — | <0.5 | <0.5 | <0.0010 | 0.9559 |
| Comparative Example 1A | bal. | 13 | 2 | 18 | — | 10 | — | — | 1 | 3 | — | — | — | 0.9 | <0.5 | <0.0010 | 0.8974 |

As shown in Table 1, the Cu ball of Executed Example 1A had purity of 3N (99.9%) or less, and the Cu ball of Executed Example 2A had purity of 4N5 (99.995%) or less. Even though the Bi and Pb contents were 10 ppm or more, the α dose was less than 0.0010 cph/cm², which was below the required value 0.0200 cph/cm². The Cu ball of Comparative Example 1A had purity higher than 4N5, and understandably the α dose was less than 0.0010 cph/cm².

In addition, as shown in Table 1, the Cu balls of Executed Example 1A and Executed Example 2A had purity of 4N5 or less, and the contents of the elements excluding Cu were 50 ppm or more, so that both the Cu balls had sphericity of 0.95 or more, which satisfies the required value 0.90 or more. On the other hand, the Cu ball of Comparative Example 1A had purity higher than 4N5, and the contents of the elements excluding Cu were less than 50 ppm, so that the sphericity was less than 0.90.

<Relationship Among Purity, Sphericity, and α Dose of Ni Ball>

As metal balls, Ni balls having different purities were made, and their sphericity and α dose were measured, and the relationship between the purity and sphericity of the Ni balls, and the α dose were verified.

(1) Making of Ni Ball

The Ni ball of Executed Example 1B was made using a Ni wire having purity of 99.9% (3N). The Ni wire used in Executed Example 1B has an α dose of 0.0034 cph/cm², a U content of 0.7 ppb, and a Th content of 0.5 ppb.

The Ni ball of Executed Example 2B was made using a Ni wire having purity of 99.995% (4N5) or less. The Ni wire used in Example 2B has purity of 99.99% (4N), an α dose of 0.0026 cph/cm², a U content of less than 0.5 ppb, and a Th content of less than 0.5 ppb.

The Ni ball of Comparative Example 1B was made using a Ni plate having purity of more than 99.995% (4N5). The Ni plate used in Comparative Example 1B has purity of 99.997% (4N7), an α dose of less than 0.0010 cph/cm², a U content of less than 0.5 ppb, and a Th content of less than 0.5 ppb.

After charging the above-described raw materials in a crucible, under atmospheric pressure, the crucible was subjected to preliminary heating for 45 minutes at 1000 degrees C., which was higher than 962 degrees C. corresponding to the boiling point $t_1$ of Po at atmospheric pressure. Thereafter, the ejection temperature was set at 1600 degrees C., preferably 1700 degrees C., the liquid molten Ni was sprayed from the nozzle at a high speed by the gas atomizing method, and the misty molten Ni was rapidly cooled to room temperature, thereby sphering the Ni balls. As a result, the Ni balls having an average particle size of 50 m were produced.

(2) Measurement of α Dose of Ni Ball

The α dose was used using an α-ray measuring device of a gas flow proportional counter, in the same manner as for the Cu ball. The measurement sample was a flat shallow container of 300 mm×300 mm in which Ni balls were bedded. This measurement sample was placed in the α-ray measuring device, allowed to stand for 24 hours in a PR-10 gas flow, and then the α dose was measured.

(3) Measurement of Sphericity of Ni Ball

The sphericity was measured by a CNC image measurement system. The measurement method was the same as that for the Cu ball, and Ultra Quick Vision, ULTRA QV350-PRO, manufactured by Mitutoyo Corporation was used.

Table 2 shows the result of elemental analysis, α dose, and sphericity of the Ni ball thus made. In Table 2, the unit is based on mass ppb for U and Th, and mass ppm for other elements. The elemental analysis was carried out by Inductively Coupled Plasma-Mass Spectrometry analysis (ICP-MS analysis) for U and Th, and Inductively Coupled Plasma-Atomic Emission Spectrometry analysis (ICP-AES analysis) for other elements.

As shown in Table 2, the Ni ball of Executed Example 1B had purity of 3N (99.9%) or less, and the Ni ball of Executed Example 2B had purity of 4N5 (99.995%) or less, and the Bi and Pb contents were 10 ppm or more. However, the α dose was less than 0.0010 cph/cm², which was below the required value 0.0200 cph/cm². The Ni ball of Comparative Example 1B had purity higher than 4N5, so that the α dose was understandably less than 0.0010 cph/cm². In addition, the α dose of the Ni balls of Executed Examples 1B and 2B was less than 0.0010 cph/cm² for at least two years. Accordingly, the recent problem, that is, the increase of the α dose with time was resolved with regard to the Ni balls of Executed Examples 1B and 2B.

In addition, as shown in Table 2, the Ni balls of Executed Examples 1B and 2B had purity of 4N5 or less, and the content of the elements excluding Ni was 50 ppm or more, so that both the Ni balls showed sphericity of 0.94 or more. On the other hand, the Ni ball of Comparative Example 1B had purity higher than 4N5, and the content of the elements excluding Ni was less than 50 ppm, so that the sphericity was less than 0.90.

The metal ball produced by the method according to the present invention may be contained in a solder joining material. Specifically, it may be added to, for example, preform solder or solder paste prepared by mixing flux and solder powder.

In addition, in the method according to the present invention, an annealing step may be added for annealing to decrease the Vickers hardness of the metal ball.

Typically, the sphered metal ball is rapidly cooled to room temperature or cooling gas temperature, from the viewpoint of improving the production amount and production rate. However, when the metal ball is produce by rapid cooling, the crystal grains of metal elements are momentarily formed, and the metal ball is shaped by the fine crystal grains before the crystal grains grow big. The metal ball formed with fine crystal grains is hard and has a high Vickers hardness; therefore, the metal ball has low durability against external stress and poor dropping shock resistance. Hence, the metal ball used for semiconductor chip mounting is required to have certain softness, more specifically, a Vickers hardness of a certain value or less.

As annealing treatment, the metal ball is heated for a predetermined time at the temperature allowing annealing, and then the heated metal ball is annealed over a long period of time. As a result, the metal ball is recrystallized, and moderate crystal growth is accelerated, so that the crystal grains of metal elements can be grown big. At this time, the sphericity of the metal ball typically decreases. However, copper oxide formed on the outermost surface of the metal

TABLE 2

| | Ni ball composition | | | | | | | | | | | | | | | | | | | | | α dose | Sphericity |
|---|---|---|---|---|---|---|---|---|---|---|---|---|---|---|---|---|---|---|---|---|---|---|---|
| | Ni | Sb | Cu | Bi | Zn | Fe | Al | As | Cd | Sn | Pb | Ag | In | Au | P | S | Mg | Ti | Co | Mn | U | Th | (cph/cm²) | of Ni ball |
| Executed Example 1B | Bal. | 18 | 23 | 71 | 2 | 39 | 0 | 58 | 2 | 63 | 67 | 49 | 18 | 2 | 2 | 19 | 0 | 5 | 61 | 13 | 0.7 | 0.5 | <0.0010 | 0.9460 |
| Executed Example 2B | Bal. | 12 | 0 | 0 | 0 | 0 | 0 | 27 | 2 | 0 | 0 | 11 | 0 | 0 | 2 | 8 | 0 | 0 | 12 | 0 | <0.5 | <0.5 | <0.0010 | 0.9426 |
| Comparative Example 1B | Bal. | 4 | 0 | 0 | 0 | 0 | 0 | 6 | 0 | 0 | 0 | 0 | 0 | 0 | 2 | 6 | 0 | 0 | 7 | 0 | <0.5 | <0.5 | <0.0010 | 0.8983 | ball works as an impurity, so that crystal grains are in a micronized state on the outermost surface of the metal ball, and extreme decrease of the sphericity of the metal ball will not occur. In addition, the α dose will not be increased by the annealing step.

As described above, in the method according to the present invention, the addition of the annealing step allows the production of a metal ball having a low α dose, high sphericity, and high dropping shock resistance.

Specifically, when a Cu ball is produced as a metal ball, the Vickers hardness is preferably 20 HV or more and 60 HV or less. If the Vickers hardness is more than 60 HV, durability against the external stress decreases, dropping shock resistance deteriorates, and cracks tend to occur. If the Vickers hardness of the Cu ball is less than 20 HV, in three-dimensional mounting, the Cu ball itself is deformed (collapsed) by the self-weight of the semiconductor chip and others, and the adequate space (standoff height) between the substrates cannot be maintained.

The annealing conditions for the Cu ball is as follows: the temperature rising time for heating from room temperature to 700 degrees C. is 60 minutes, the retention time for keeping the temperature at 700 degrees C. is 60 minutes, and the cooling time for cooling from 700° C. to the room temperature is 120 minutes. Cooling in the furnace is carried out using a cooling fan installed in the furnace. In addition, in order to remove the oxide film formed on the Cu ball surface by annealing treatment, the annealed Cu ball may be immersed in dilute sulfuric acid, thereby carrying out acid treatment.

The invention claimed is:

1. A method of producing a metal ball, characterized in that the method comprises the steps of:

melting a pure metal by heating the pure metal at a heating temperature which is set to be higher than a boiling point of Po to be removed, higher than a melting point of the pure metal, and lower than a boiling point of the pure metal, according to the boiling points and melting point changing depending on the atmosphere, the pure metal containing a U content of 5 ppb or less, a Th content of 5 ppb or less, purity of 99.9% or more and 99.995% or less, and a Pb content of 10 ppm or more and less than 50 ppm, and the pure metal having the boiling point at atmospheric pressure higher than the boiling point at atmospheric pressure of the Po to be removed among impurities contained in the pure metal; and sphering the molten pure metal into a ball, wherein the ball has a diameter of from 1 to 1000 pm.

2. The method of producing the metal ball according to claim 1, wherein the melting point of the pure metal at the atmospheric pressure is 900 degrees C. or higher and the boiling point thereof is 962 degrees C. or higher.

3. The method of producing the metal ball according to claim 1, further comprising an annealing step of annealing the sphered metal ball.

4. A joining material comprising: the metal ball produced by the method according to claim 1.

5. A metal ball produced by the method according to claim 1, wherein the metal ball has an α dose of 0.0200 cph/cm$^2$ or less and sphericity of 0.90 or more.

6. A joining material comprising: the metal ball of claim 5.

7. The method of producing the metal ball according to claim 2, further comprising an annealing step of annealing the sphered metal ball.

8. A joining material comprising: the metal ball produced by the method according to claim 2.

9. A joining material comprising: the metal ball produced by the method according to claim 3.

10. A joining material comprising: the metal ball produced by the method according to claim 7.

11. A metal ball produced by the method according to claim 2, wherein the metal ball has an α dose of 0.0200 cph/cm$^2$ or less and sphericity of 0.90 or more.

12. A metal ball produced by the method according to claim 3, wherein the metal ball has an α dose of 0.0200 cph/cm$^2$ or less and sphericity of 0.90 or more.

13. A metal ball produced by the method according to claim 7, wherein the metal ball has an α dose of 0.0200 cph/cm$^2$ or less and sphericity of 0.90 or more.

14. A joining material comprising: the metal ball of claim 11.

15. A joining material comprising: the metal ball of claim 12.

16. A joining material comprising: the metal ball of claim 13.

* * * * *